United States Patent
Zhang et al.

(10) Patent No.: US 10,084,060 B2
(45) Date of Patent: Sep. 25, 2018

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Zhe-Hao Zhang, Hsinchu (TW);
Tung-Wen Cheng, New Taipei (TW);
Chang-Yin Chen, Taipei (TW); Kuo Hui Chang, Taoyuan County (TW);
Che-Cheng Chang, New Taipei (TW);
Mu-Tsang Lin, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/460,535

(22) Filed: Aug. 15, 2014

(65) Prior Publication Data
US 2016/0049483 A1    Feb. 18, 2016

(51) Int. Cl.
*H01L 31/112* (2006.01)
*H01L 29/66* (2006.01)
(Continued)

(52) U.S. Cl.
CPC .. *H01L 29/66545* (2013.01); *H01L 29/42368* (2013.01); *H01L 29/4966* (2013.01);
(Continued)

(58) Field of Classification Search
CPC ............... H01L 29/517; H01L 29/6656; H01L 29/66636; H01L 29/7848; H01L 29/66545; H01L 21/823814; H01L 21/28247
See application file for complete search history.

(56) References Cited

U.S. PATENT DOCUMENTS 5,145,571 A *  9/1992  Lane ................. H01L 21/76885
                                            205/123
5,872,382 A *  2/1999  Schwalke ........... H01L 21/2257
                                            257/344
(Continued)

OTHER PUBLICATIONS

Office action dated Jul. 25, 2018 for corresponding China application 201410804686.X.

*Primary Examiner* — Joseph C Nicely
*Assistant Examiner* — David Goodwin
(74) *Attorney, Agent, or Firm* — WPAT, P.C., Intellectual Property Attorneys; Anthony King

(57) ABSTRACT

The present disclosure provide a semiconductor structure, including a substrate having a top surface; a gate over the substrate, the gate including a footing region in proximity to the top surface, the footing region including a footing length laterally measured at a height under 10 nm above the top surface; and a spacer surrounding a sidewall of the gate, including a spacer width laterally measured at a height of from about 10 nm to about 200 nm above the top surface. The footing length is measured, along the top surface, from an end of a widest portion of the footing region to a vertical line extended from an interface between a gate body and the spacer, and the spacer width is substantially equal to or greater than the footing length.

19 Claims, 15 Drawing Sheets

(51) Int. Cl.
   *H01L 29/423*   (2006.01)
   *H01L 29/49*    (2006.01)
   *H01L 29/51*    (2006.01)
   *H01L 29/78*    (2006.01)
   *H01L 21/8238*  (2006.01)

(52) U.S. Cl.
   CPC ...... *H01L 29/517* (2013.01); *H01L 29/66636* (2013.01); *H01L 29/7834* (2013.01); *H01L 29/7848* (2013.01); *H01L 21/823814* (2013.01)

(56) References Cited

U.S. PATENT DOCUMENTS

| | | | | |
|---|---|---|---|---|
| 6,190,996 B1 * | 2/2001 | Mouli | ............... | H01L 21/764 257/522 |
| 6,271,094 B1 * | 8/2001 | Boyd | ............... | H01L 21/28114 257/E21.205 |
| 7,566,924 B2 * | 7/2009 | Lee | ............... | H01L 21/823468 257/288 |
| 8,216,906 B2 * | 7/2012 | Tsai | ............... | H01L 29/7848 257/E21.619 |
| 8,258,588 B2 * | 9/2012 | Lin | ............... | H01L 29/4983 257/410 |
| 8,569,139 B2 * | 10/2013 | Nieh | ............... | H01L 21/823807 257/E21.431 |
| 8,598,661 B2 * | 12/2013 | Wang | ............... | B82Y 40/00 257/346 |
| 8,853,020 B2 * | 10/2014 | Nishisaka | ............... | B82Y 10/00 257/E21.409 |
| 2006/0094177 A1 * | 5/2006 | Ohta | ............... | H01L 21/823418 438/197 |
| 2006/0186484 A1 * | 8/2006 | Chau | ............... | H01L 29/66628 257/401 |
| 2007/0018205 A1 * | 1/2007 | Chidambarrao | ............... | H01L 21/823412 257/288 |
| 2007/0090455 A1 * | 4/2007 | Lim | ............... | H01L 21/84 257/338 |
| 2009/0001480 A1 * | 1/2009 | Cheng | ............... | H01L 29/42368 257/387 |
| 2010/0044804 A1 * | 2/2010 | Chen | ............... | H01L 21/28088 257/410 |
| 2010/0320503 A1 * | 12/2010 | Chong | ............... | H01L 29/66628 257/190 |
| 2011/0031562 A1 * | 2/2011 | Lin | ............... | H01L 29/4983 257/410 |
| 2011/0049585 A1 * | 3/2011 | Beyer | ............... | H01L 21/0206 257/288 |
| 2012/0108026 A1 * | 5/2012 | Nieh | ............... | H01L 21/823807 438/300 |
| 2012/0205715 A1 * | 8/2012 | Kwok | ............... | H01L 29/0847 257/190 |
| 2012/0241816 A1 * | 9/2012 | Flachowsky | ............... | H01L 21/26506 257/192 |
| 2013/0015509 A1 * | 1/2013 | Haran | ............... | H01L 29/6653 257/288 |
| 2013/0052833 A1 * | 2/2013 | Ranjan | ............... | H01L 21/31116 438/714 |
| 2013/0119487 A1 * | 5/2013 | Lin, Jr. | ............... | H01L 21/0206 257/412 |
| 2014/0131735 A1 * | 5/2014 | Hoentschel | ............... | H01L 21/84 257/77 |

* cited by examiner

SEMICONDUCTOR STRUCTURE AND MANUFACTURING METHOD OF THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Additionally, as technology nodes shrink, in some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first". The "gate last" process allows for reduced number of subsequent processes, including high temperature processing, that must be performed after formation of the gate.

In addition to the MG electrode, it is often desirable to have epitaxial material that is strained to be positioned at the source/drain regions of a transistor. "Strain" may influence the electrical properties of semiconductors materials, such as silicon, carbon-doped silicon, germanium and silicon germanium alloys. Tensile strain helps to enhance electron mobility, which is particularly desirable for nMOS devices, while compressive strain helps to enhance hole mobility, which is particularly desirable for pMOS devices. The performance uniformity among the p- or n-MOS devices within a wafer is dictated by various factors. Thus, a structure and/or a method tuning for obtaining a greater performance uniformity of the p- or n-MOS devices with strained epitaxy region(s) and metal gate electrodes are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
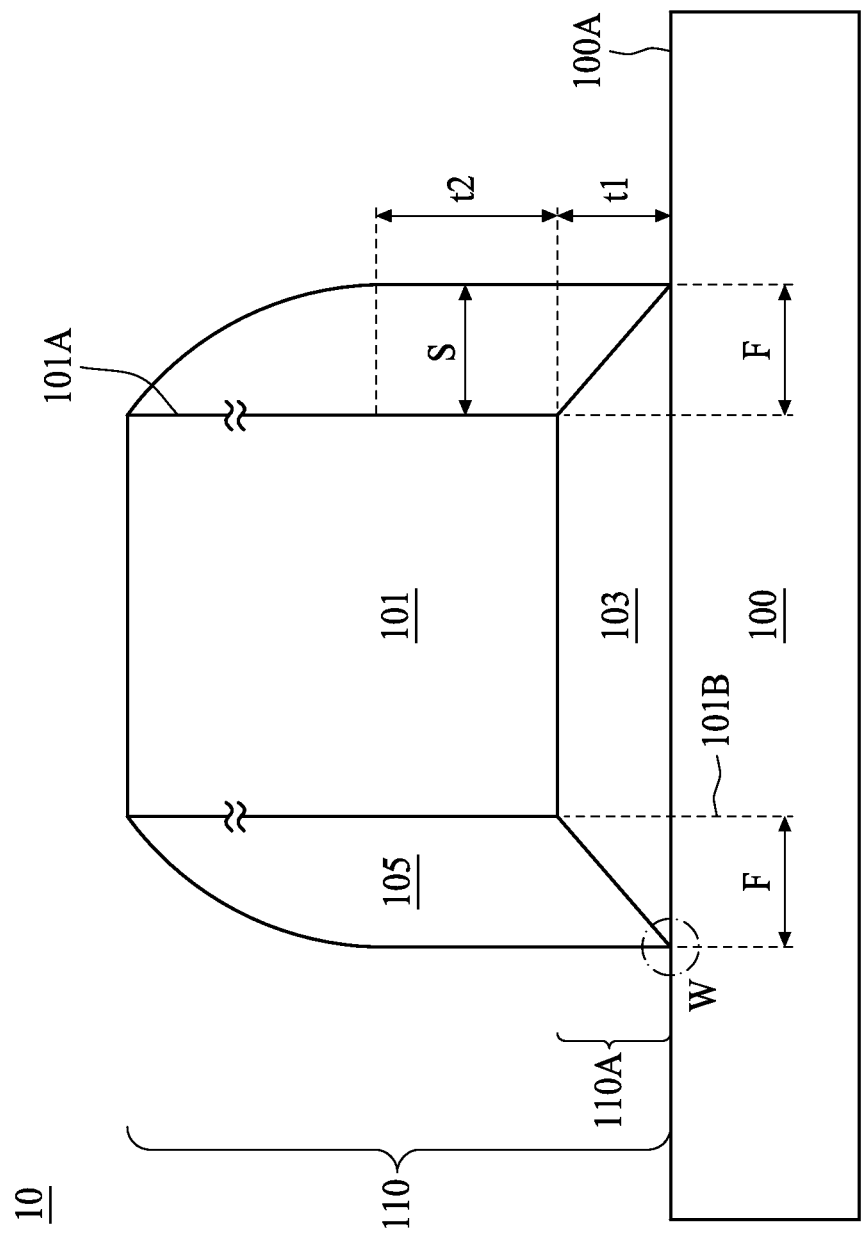
FIG. 1 is a cross sectional view of a semiconductor structure with an offset side wall profile, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Along with the decrease of device scale, gate structures in a CMOS transistor demonstrate footing at an interface between the gate body and the substrate supporting thereof. The footing referred herein directs to an offset between a side edge of the bottom portion of the gate structure and a side edge of the gate body. More detailed and quantified description of footing is provided in FIG. 1 of the present disclosure. The cause of footing may be non-optimal etching operation or incomplete cleaning between consecutive etching operations. The footing feature can be augmented when a sidewall spacer is formed surrounding the sidewall of the gate body and the footing region. For example, after blanket depositing a layer of spacer materials over the gate structure including the gate body and the footing region, an isotropic etch operation is perfumed to remove the spacer materials from top of the gate structure and from top of the substrate surface supporting the gate structure. Because of the conformity of the layer of spacer materials, a portion of the spacer layer in proximity to the footing of the original gate structure remains, covering and extending the footing profile of the original gate structure.

The footing at the original gate structure acts as a hard mask, preventing lightly doped drain (LDD) dopants from entering the substrate covered by the footing. Furthermore, the footing feature inherited by the layer of spacer materials may also prevent the heavily doped source or drain (S/D) dopants from entering the pre-designated region. The LDD and S/D region described herein are collectively referred to "source region" or "drain region". Hence, distance between source region and drain region (hereby referred to a "channel length") can be extended without precise control. Device performance can be deteriorated when the channel lengths of same type of transistors show a wide distribution across the wafer. Device speed and within wafer electrical uniformity can be deteriorated by the footing feature.

Furthermore, for a CMOS transistor with a metal gate and epitaxy regions, the footing feature (including the footing appeared in the original gate structure and footing of the sidewall spacer inherited from the original footing) can affect proximity of the epitaxy region regrown at the S/D region. The proximity discussed herein is measured in a transverse direction along a surface of the substrate, from an interface between a gate body and a sidewall spacer thereof to a point where the epitaxy region intercepting with the surface of the substrate. In other words, the proximity of an epitaxy region is an indicator to a channel length given width of the gate body is known. If the proximity of the epitaxy regions varies within a wide range, the channel length across transistors within a wafer shows a wide distribution. Similarly, device speed and within wafer electrical uniformity can be deteriorated by the footing feature in a CMOS transistor with a metal gate and epitaxy regions.

The present disclosure provides a semiconductor structure and a method for manufacturing thereof. By following the operations discussed herein, the dimension of the footing can be reduced and controlled, rendering better device performance and within wafer device uniformity. Referring to FIG. 1, FIG. 1 is a cross sectional view of a semiconductor structure 10 with an offset sidewall profile according to some embodiments of the present disclosure. The semiconductor structure 10 includes a substrate 100, a gate 110 over the substrate 100, a spacer 105 surrounding a sidewall 101A of a gate body 101, and a footing region 110A at the interface between the gate 110 and a top surface 100A of the substrate 100. In some embodiments, the footing region 110A can be made of interfacial layer, high k dielectric material, polysilicon, TiN, TaN, or the combinations thereof. In FIG. 1, the footing region 110A is made of high k dielectric material 103. Note that in FIG. 1, a height of the footing region 110A and a height of the gate 110 are not drawn to scale. In some embodiments, the height of the footing region 110A is under 10 nm, and the height of the gate 110 is more than 200 nm. Also note in FIG. 1, the thickness of the high k dielectric material 103 needs not be occupying the entire thickness of the footing region 110A. In some embodiments, the high k dielectric materials 103 contribute to only half or a portion of the footing region 110A thickness (not shown).

Figure 2:
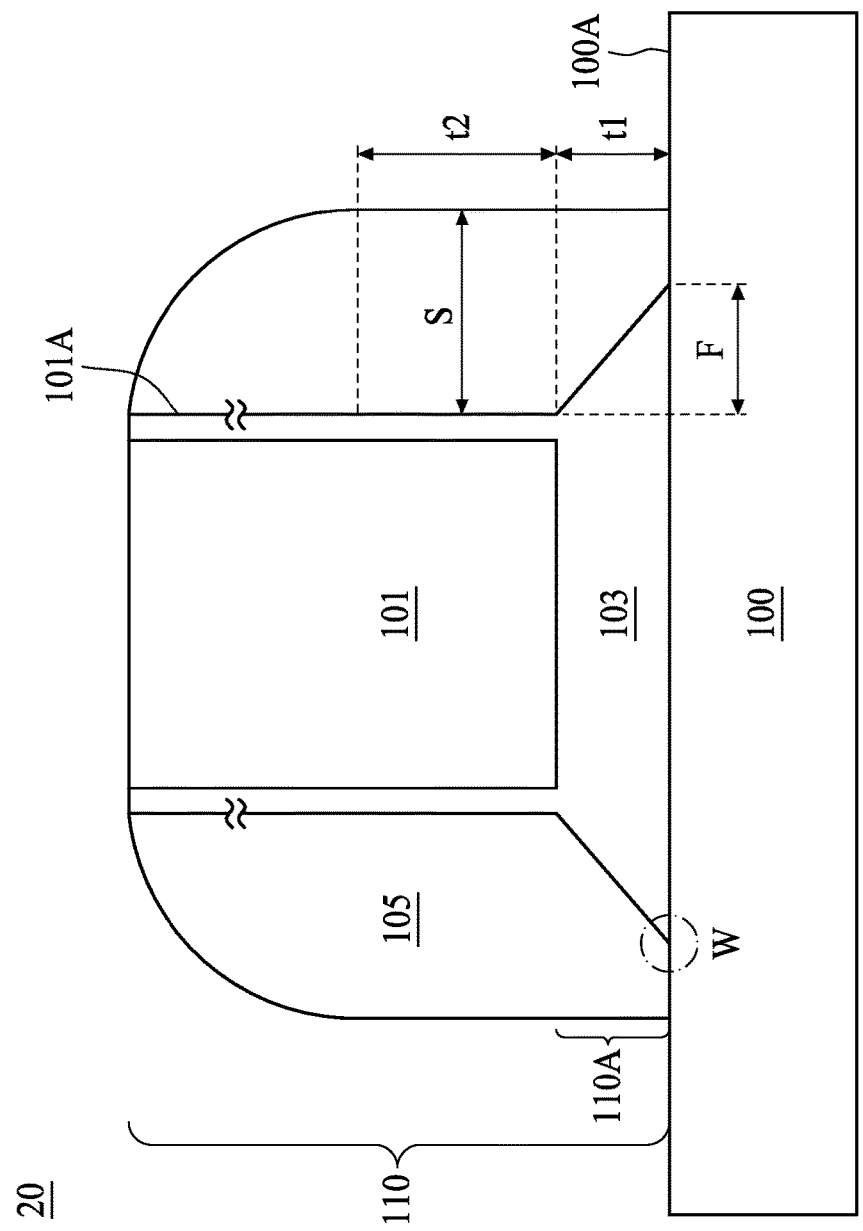
FIG. 2 is a cross sectional view of a semiconductor structure with an offset side wall profile, in accordance with some embodiments.

Still referring to FIG. 1, a footing length F of the footing region 110A can be laterally measured at a height range t1 under 10 nm above the top surface 100A. In other words, the footing length F is measured from an end of a widest portion W of the footing region 110A to a vertical line 101B extended from the interface 101A between a gate body 101 and the spacer 105. Still in other words, the footing length F is a measurement of the offset between an edge of the footing region 110A and an edge of the gate body 101. Therefore, a footing length F can be measured at 2 nm, 4 nm, 6 nm, 8 nm, etc. above the top surface 100A, depending on the height of the widest portion W of the footing region 110A. A spacer width S, as shown in FIG. 1, is laterally measured at a height range t2 of from about 10 nm to about 200 nm above the top surface 100A. Within the height range t2, a uniform thickness can be measured. In some embodiments, the spacer width S is substantially equal to or greater than the footing length F. As shown in FIG. 1, the spacer width S and the footing length F are substantially identical. However, S and F can be of different value as long as S is greater than F. In some embodiments, the spacer width is in a range of from about 2 nm to about 20 nm, Referring to FIG. 2, FIG. 2 is a cross sectional view of a semiconductor structure 20 with an offset sidewall profile, in accordance with some embodiments. The numeral labels in FIG. 2 with identical notations as those in FIG. 1 refer to the same or equivalent structures thereof and is not described here for simplicity. FIG. 2 demonstrates an embodiment where the spacer thickness S is greater than the footing length F. In this embodiment, a bottom of the sidewall spacer 105 is in contact with the top surface 100A. Note in FIG. 2, the high k dielectric layer 103 is not only positioned over the top surface 100A but also deposited at an inner sidewall 101A of the gate body 101. Referring to FIG. 1 and FIG. 2, the gate body can be a metal gate or a polysilicon gate. In some embodiments, semiconductor structure 10 of FIG. 1 is manufactured through a "high k first" operation in which the high k dielectric materials 103 is deposited before the formation of a replacement gate (not shown in the final product). In other embodiments, semiconductor structure 20 of FIG. 2 is manufactured through a "high k last" operation in which the high k dielectric materials 103 is deposited after the removal of a replacement gate (not shown in the final product), and thus conformally deposited at the sidewall and bottom of a trench resulted from the removal of said replacement gate. As discussed previously, the thickness of the high k dielectric material 103 shown in FIG. 2 needs not be occupying the entire thickness of the footing region 110A. In some embodiments, the high k dielectric materials 103 contribute to only half or a portion of the footing region 110A thickness (not shown), or possess a comparable thickness to the high k dielectric materials 103 deposited at the sidewall of the gate body 101.

Figure 3:
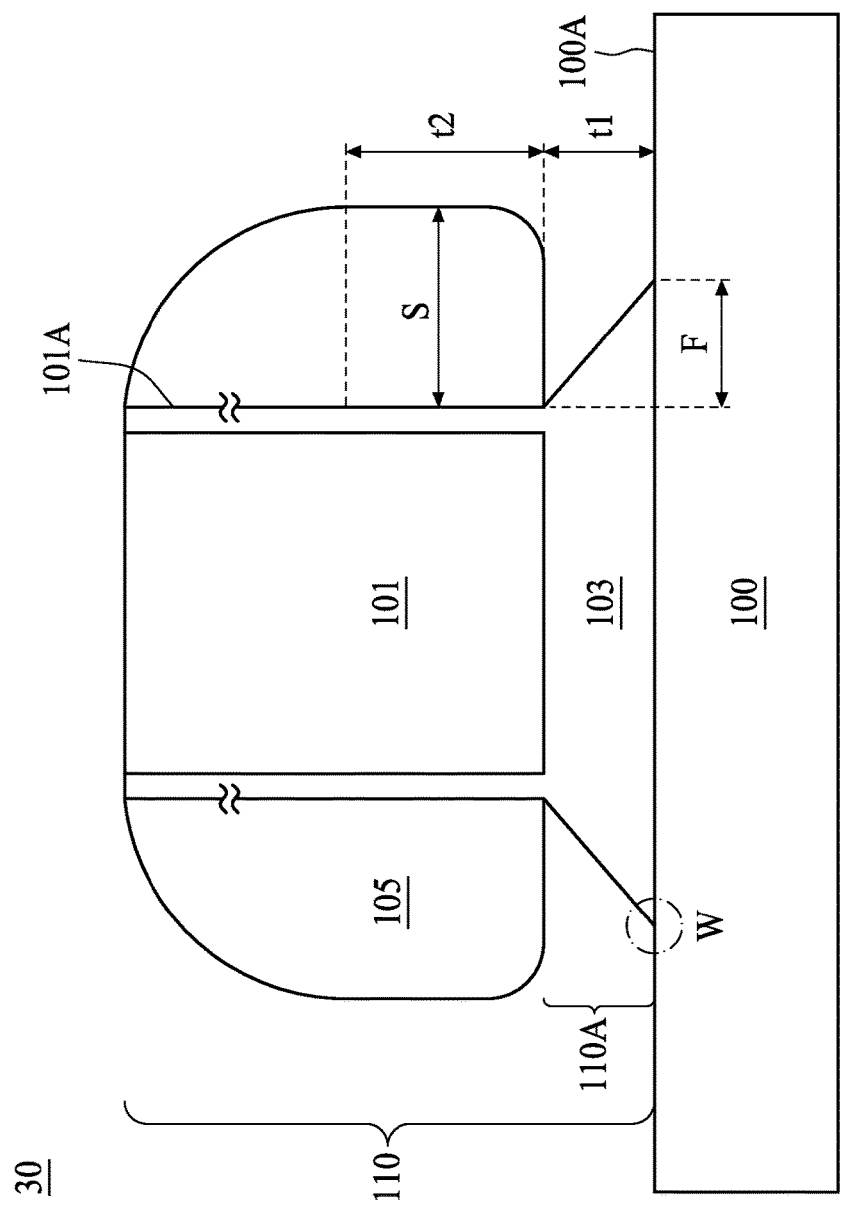
FIG. 3 is a cross sectional view of a semiconductor structure with an offset side wall profile, in accordance with some embodiments.

Referring to FIG. 3, FIG. 3 is a cross sectional view of a semiconductor structure 30 with an offset side wall profile, in accordance with some embodiments. The numeral labels in FIG. 3 with identical notations as those in FIG. 1 and FIG. 2 refer to the same or equivalent structures thereof and is not described here for simplicity. In FIG. 3, a bottom of the spacer 105 is not contacting the top surface 100A due to an alternative overetch condition. However, the spacer width S is still greater than the footing length F in this embodiment.

Figure 4:
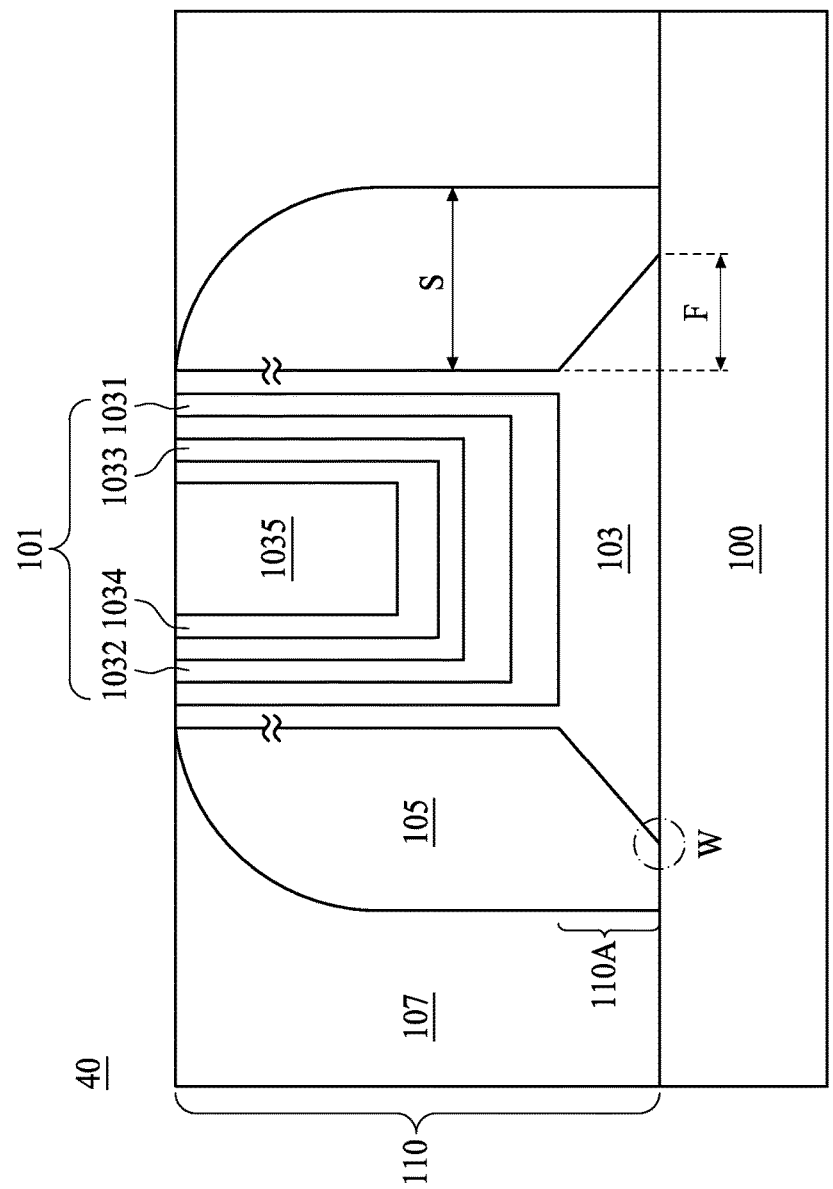
FIG. 4 is a cross sectional view of a semiconductor structure with an offset side wall profile and a metal gate, in accordance with some embodiments.

Referring to FIG. 4, FIG. 4 is a cross sectional view of a semiconductor structure 40 with an offset sidewall profile, in accordance with some embodiments. The numeral labels in FIG. 4 with identical notations as those in previous figures refer to the same or equivalent structures thereof and is not described here for simplicity. In FIG. 4, a dielectric layer 107 surrounds the gate 110 (including the gate body 101 and the spacer 105), and the gate body 101 is an N-type metal gate composed of several layers. For example, a high k dielectric layer 103 is deposited at the footing region 110A and at the sidewall 101A of the gate body 101. A high k dielectric layer cap 1031, for example, a TiN or a TaN layer, is positioned over the high k dielectric layer 103. An optional etch stop layer 1032 can be positioned over the cap 1031. A P-work function layer 1033 such as a TiN layer, an N-work function layer 1034 such as an aluminum containing trilayer (TaN/TiAl/TiN), a TaAl layer, or the combinations thereof, and a tungsten filling layer 1035 are arranged as shown in FIG. 4. Similarly, a P-type metal gate (not shown in FIG. 4) can be formed in a similar manner in the absent of the N-work function layer 1034. In some embodiments, for an NFET, the metal layer having a work function substantially equals to or less than about 4.2 eV is referred to as N-work function layer. For an NFET, the metal layer having a work function substantially equals to or greater than about 5.2 eV is referred to as P-work function layer. As discussed previously, semiconductor structure 40 in FIG. 4 is formed by a "high-k last" operation.

Figure 5:
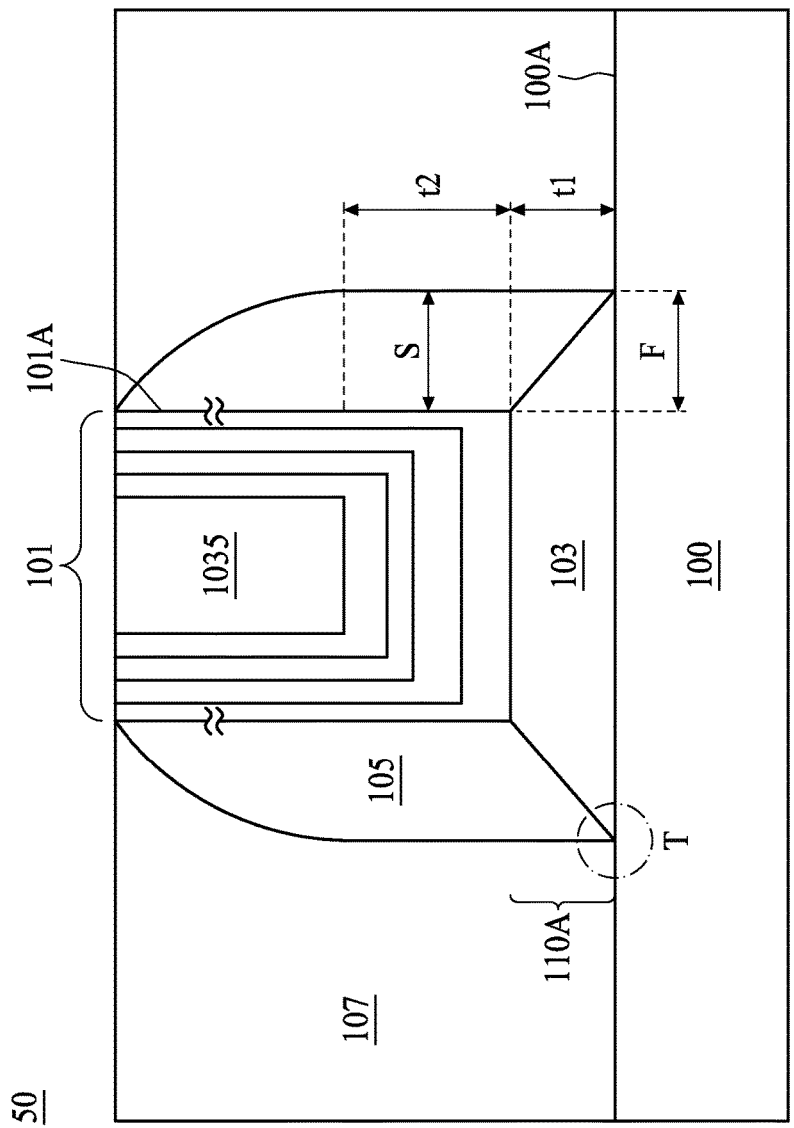
FIG. 5 is a cross sectional view of a semiconductor structure with an offset side wall profile and a metal gate, in accordance with some embodiments.

Referring to FIG. 5, FIG. 5 is a cross sectional view of a semiconductor structure 50 with an offset side wall profile and a metal gate, in accordance with some embodiments of the present disclosure. The numeral labels in FIG. 5 with identical notations as those in previous figures refer to the same or equivalent structures thereof and is not described here for simplicity. Comparing FIG. 4 and FIG. 5, the spacer 105 in FIG. 5 possesses a spacer width S substantially identical to the footing length F measured at the footing region 110A. Hence, the dielectric layer 107 surrounding the spacer 105, the spacer 105, and the widest point of the footing region W (see the label in FIGS. 1 to 4) form a triple point T. In other words, if the spacer width S is substantially greater than the footing length F, as shown in the semiconductor structure in FIG. 4, the dielectric layer 107, the spacer 105, and the widest point of the footing region 103 do not form a triple point T as seen in FIG. 5. Furthermore, since high k dielectric layer 103 in FIG. 5 is only positioned at least at the bottom of the footing region 110A but not positioned at the sidewall 101A of the gate body 101, the semiconductor structure 50 is formed by a "high k first" operation.

Figure 6:
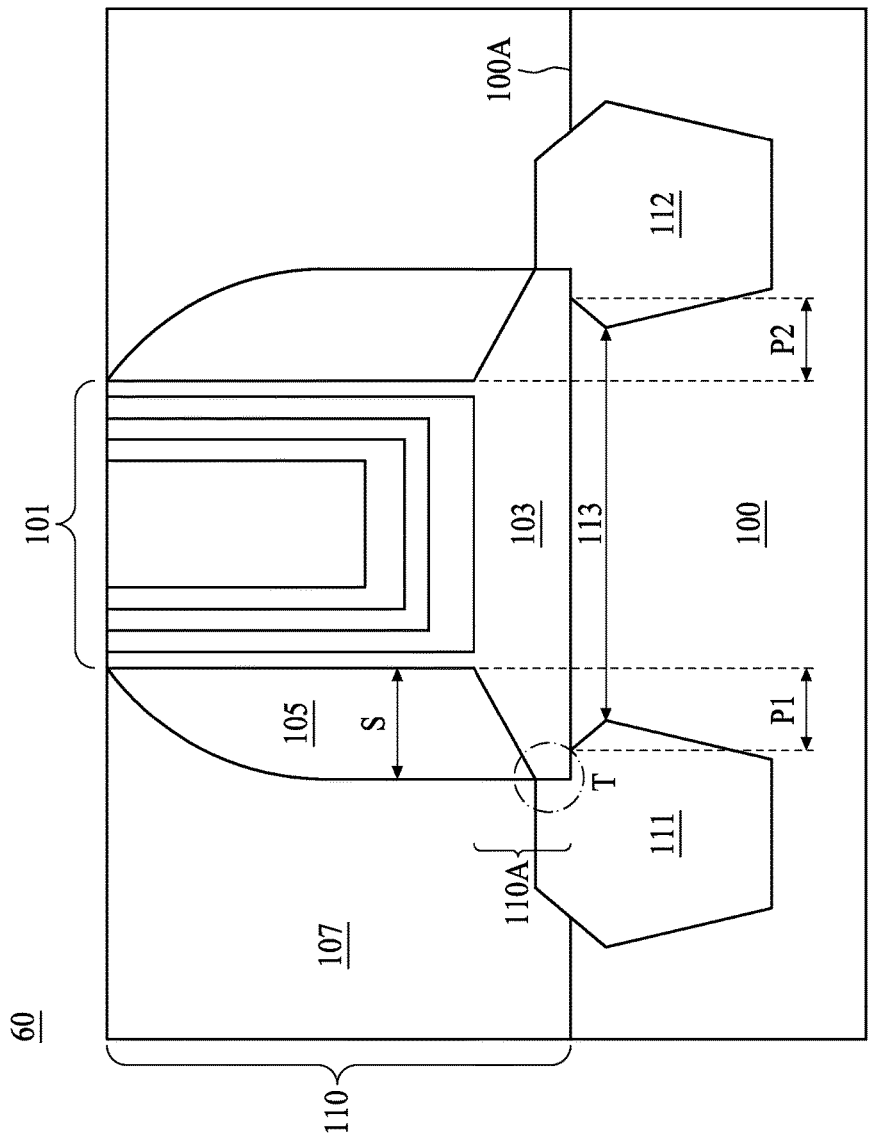
FIG. 6 is a cross sectional view of a semiconductor structure with an offset side wall profile and an epitaxy region, in accordance with some embodiments.

Referring to FIG. 6, the semiconductor structure 60 further includes a first epitaxy region 111 partially positioned in the substrate 100. The first epitaxy region 111 can be made of materials with lattice constant different from that of the substrate, and an upper portion of the first epitaxy region 111 is raised above the top surface 100A. Note in a lateral direction, a portion of the first epitaxy region 111 close to the channel is covered by the footing region 110A and the spacer 105. Proximity is a characteristic of an epitaxy region, and is measured in a transverse direction along a top surface 100A, from an interface between a gate body 101 and a sidewall spacer 105 thereof to a point where the epitaxy region 111 intercepting with the top surface 100A. As show in FIG. 6, a first proximity P1 measured at the first epitaxy region 111 is smaller than the spacer width S. Similarly, a second proximity P2 measured at a second epitaxy region 112, which is positioned at an opposite side of the channel under the gate body 101, is also smaller than the spacer width S. In some embodiments, the first proximity P1 and the second proximity P2 are substantially identical. That is, the geometry of the epitaxy region in the semiconductor structure discussed herein can be effectively controlled when the footing feature becomes controllable. In other words, a channel length 113 of the semiconductor structures of the present disclosure is not only shorter compared to the case where footing feature is prominent and uncontrollable, but also possessing a uniform length in devices across the wafer.

Figure 7:
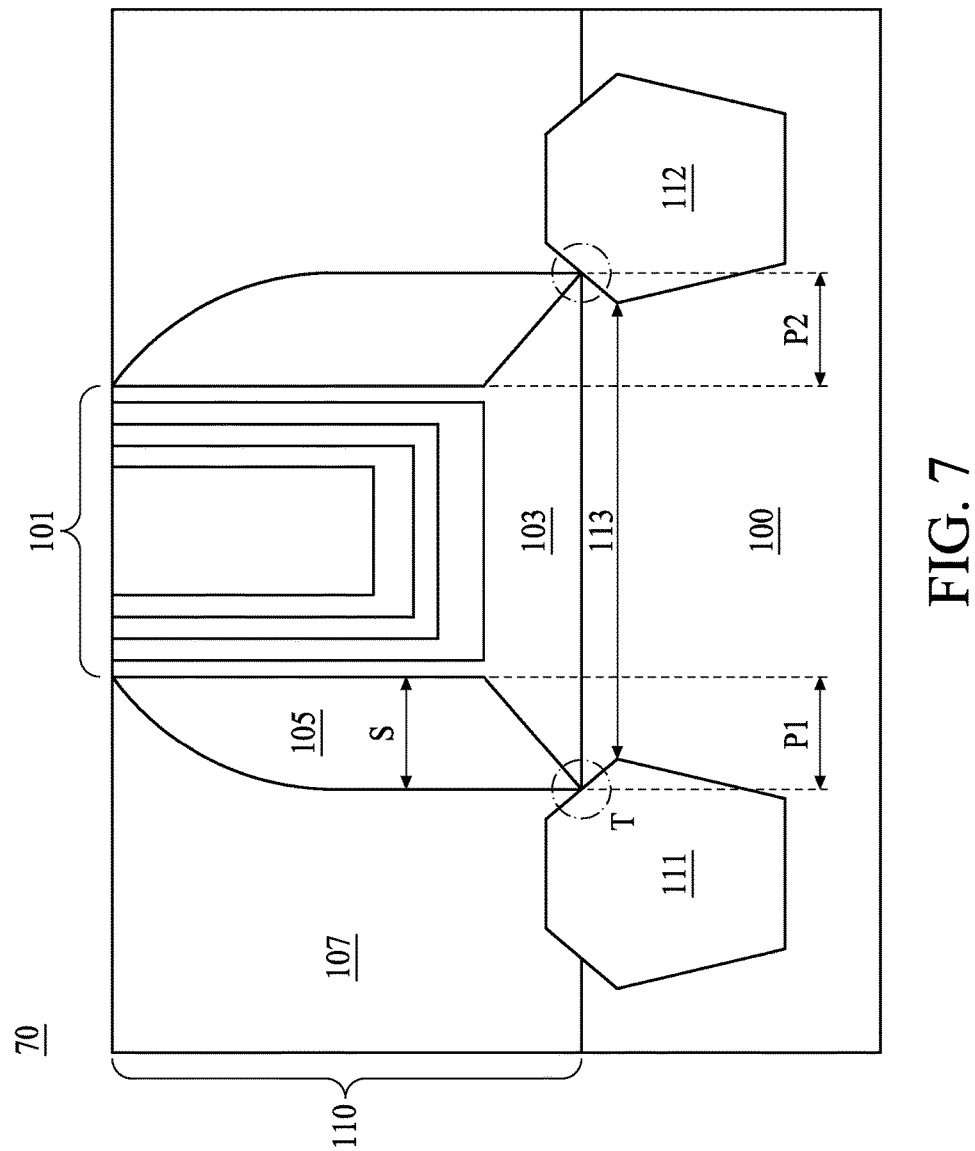
FIG. 7 is a cross sectional view of a semiconductor structure with an offset side wall profile and an epitaxy region, in accordance with some embodiments.

Comparing FIG. 6 and FIG. 7, the first proximity P1 and the second proximity P2 shown in semiconductor structure 60 are smaller than the spacer width S. However, the first proximity P1 and the second proximity P2 shown in semiconductor structure 70 are substantially equal to the spacer width S. On the other hand, the first proximity P1 and the second proximity P2 shown in semiconductor structure 70 are substantially equal to the spacer footing length F. Note the triple point T shown in both FIG. 6 and FIG. 7 are in contact with the first epitaxy region 111 or the second epitaxy region 112. In other words, the spacer 105, the footing region 110A, the dielectric layer 107, and the epitaxy region (111 or 112) meet together and form a quadruple point. In some embodiments, semiconductor structure 70 can be a FinFET device where the first epitaxy region 111 and the second epitaxy region 112 are partially buried in a semiconductor fin 100. Furthermore, under the condition that the gate 110 dimension in FIG. 6 and FIG. 7 are identical, semiconductor structure 60 having a smaller proximity, which can be formed by special etching operations, demonstrates a shorter channel length 113 than that of the semiconductor structure 70 having a greater proximity.

Figure 8:
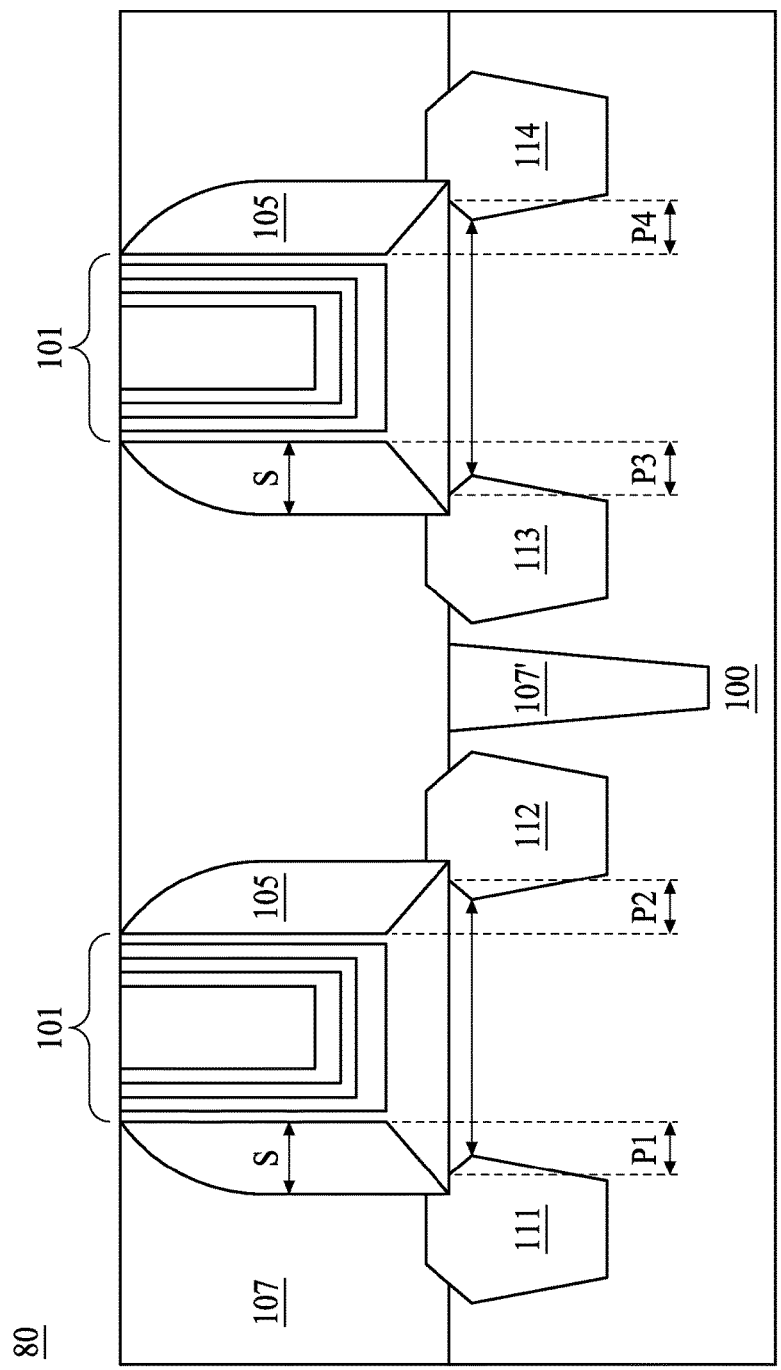
FIG. 8 is a cross sectional view of a semiconductor structure with offset side wall profiles and epitaxy regions, in accordance with some embodiments.

Referring to FIG. 8, FIG. 8 is a cross sectional view of a semiconductor structure 80 with offset sidewall profiles and epitaxy regions, in accordance with some embodiments. FIG. 8 shows two adjacent transistors electrically separated by an isolation structure 107'. The left transistor has a first epitaxy region 111 and a second epitaxy region 112, whereas the right transistor has a third epitaxy region 113 and a fourth epitaxy region 114. In some embodiments, a third proximity P3 of the third epitaxy region 113 is substantially identical to a fourth proximity P4 of the fourth epitaxy region 114. In other embodiments, the four proximities P1, P2, P3, and P4 are substantially identical. FIG. 8 can also be referred to two non-adjacent transistors located at different positions on a wafer, and the four proximities P1, P2, P3, and P4 of those non-adjacent transistors are substantially identical.

Figure 9:
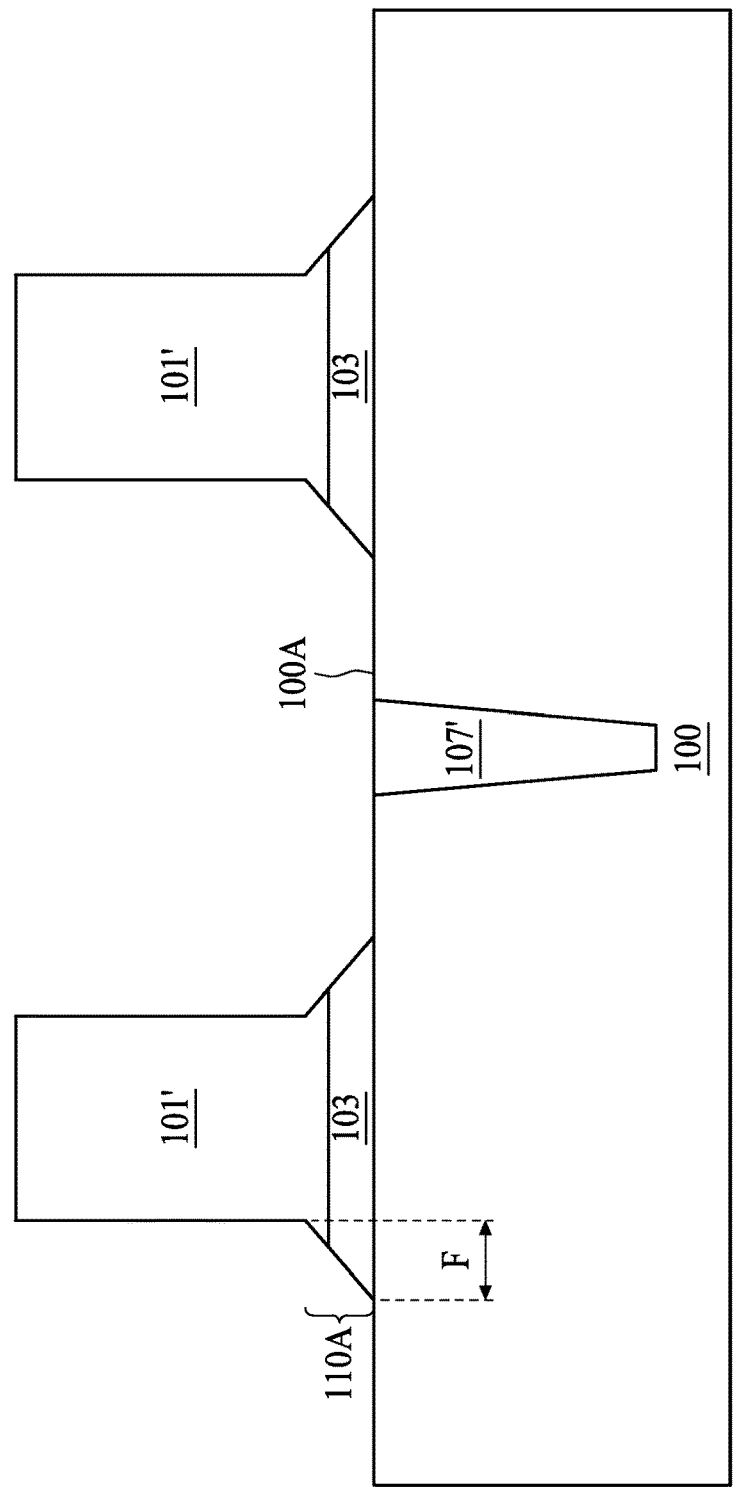
FIG. 9 to FIG. 15 are cross sectional views of fragmental operations for manufacturing a semiconductor structure with offset side wall profiles, epitaxy regions, and metal gates, in accordance with some embodiments.
Figure 13:
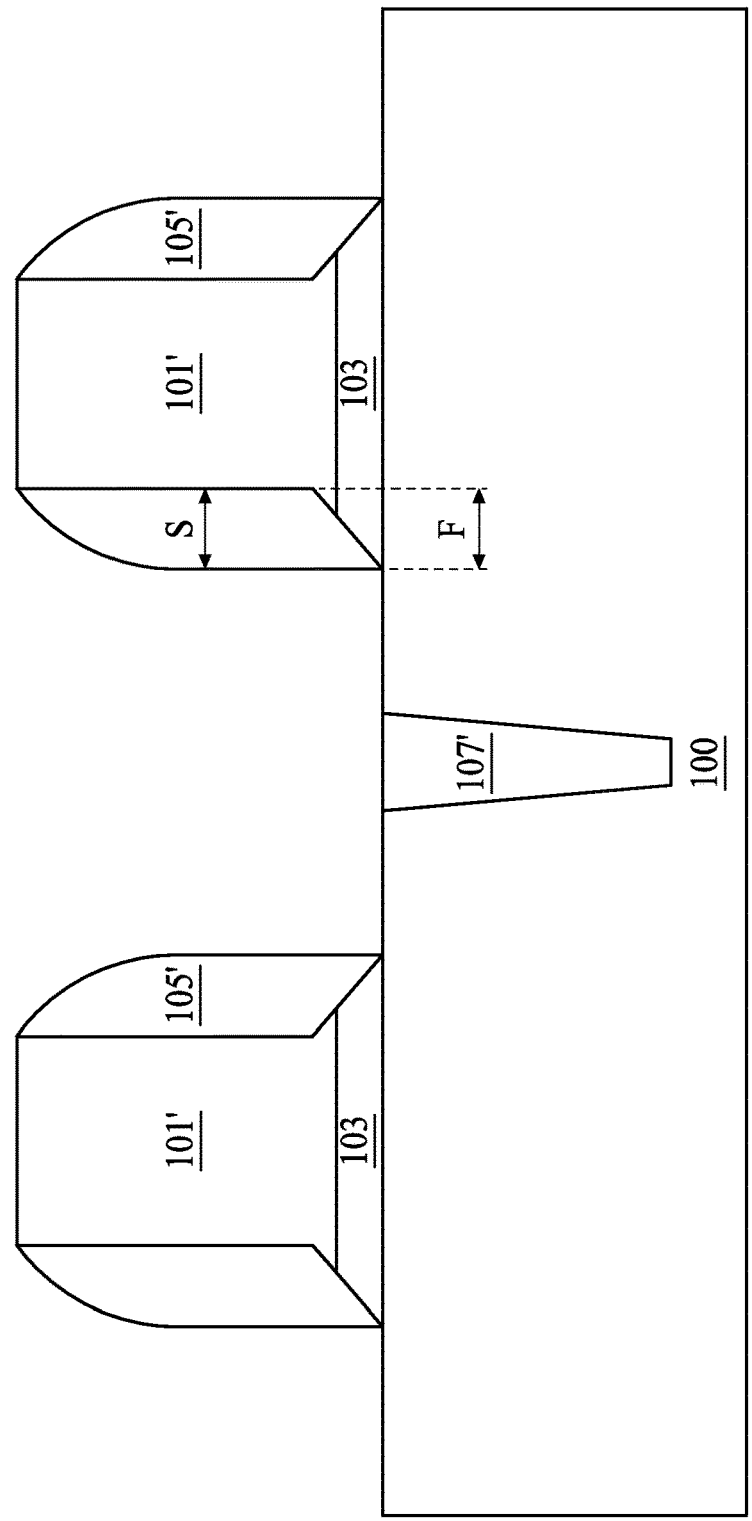
Figure 14:
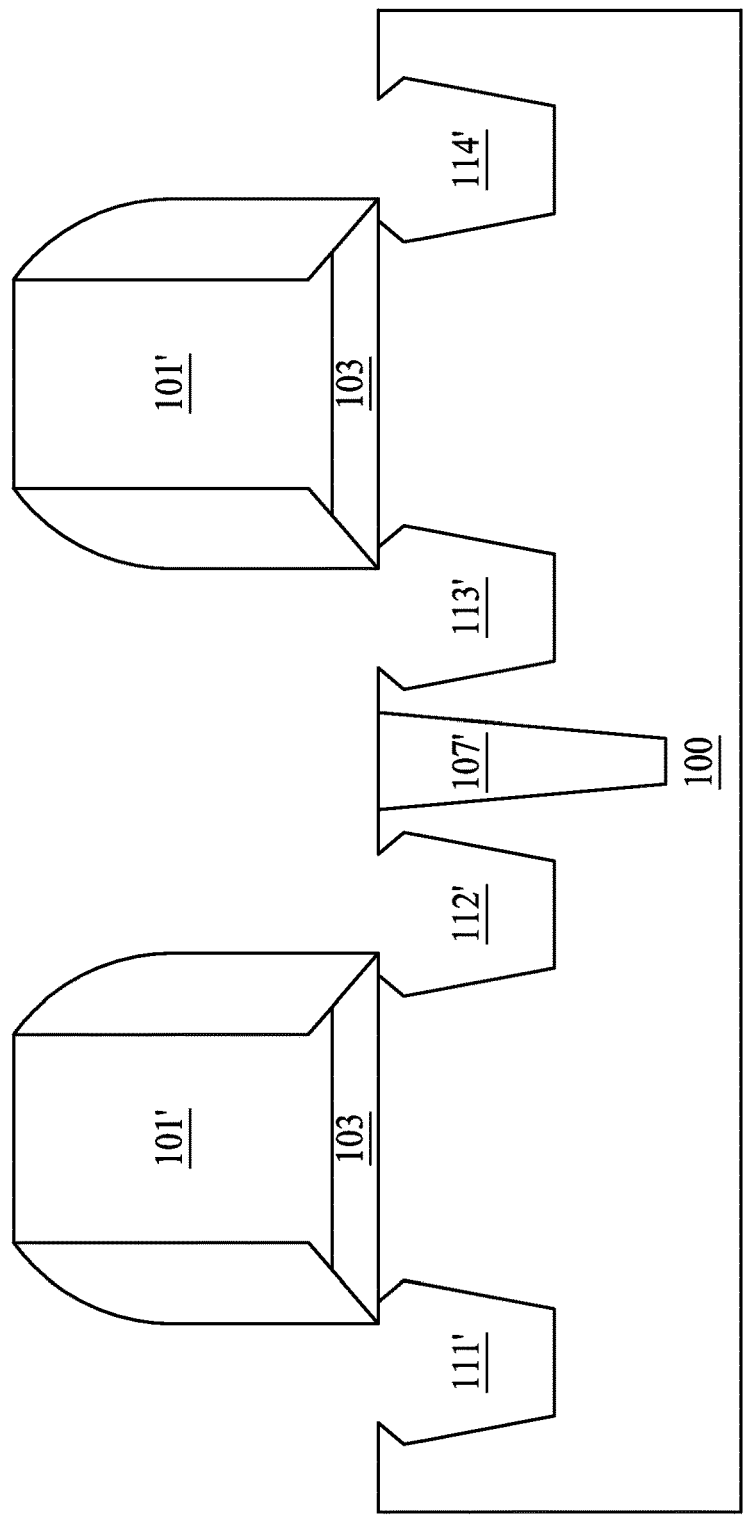
Figure 15:
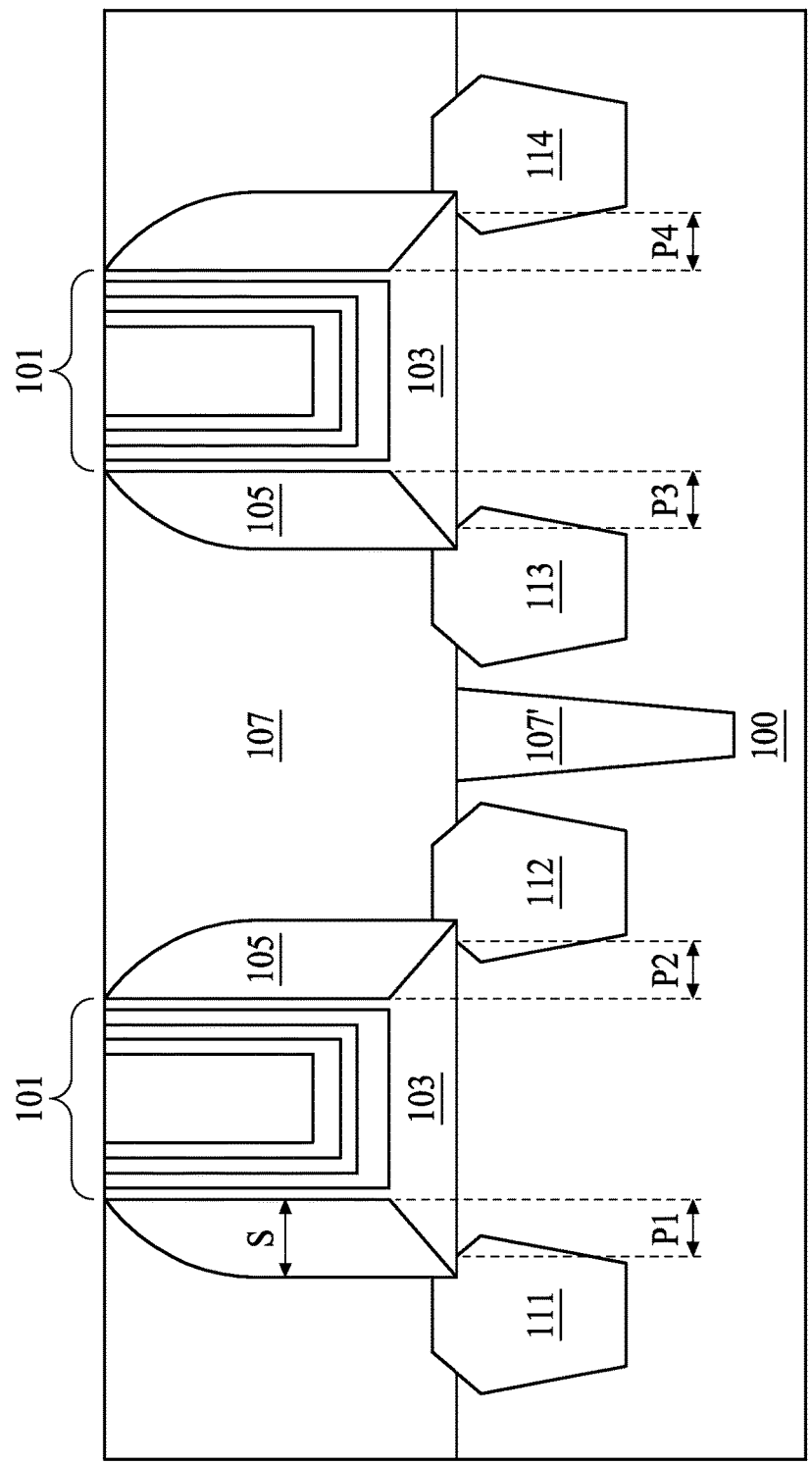

FIG. 9 to FIG. 15 are cross sectional views of fragmental operations for manufacturing a semiconductor structure with offset side wall profiles, epitaxy regions, and metal gates, in accordance with some embodiments. FIG. 9 shows the formation and patterning of a high k dielectric layer 103 and a dummy gate 101' over a substrate 100. The dummy gate 101' referred herein can include a polysilicon gate body and a hardmask (not shown) laid thereover. In some embodiments, the hardmask includes TEOS. FIG. 9 demonstrates a structure of a "high k first" operation since the high k dielectric layer 103 is formed at the operation prior to the formation of the dummy gate 101'. Of course, the "high k last" operation can be performed by depositing high k dielectric materials in a dummy gate trench (not shown) after the removal of the dummy gate 101', as can be seen in FIG. 15. People having ordinary skill in the art shall understand that the "high k first" and "high k last" operation are within the contemplated scope of the present disclosure, and an offset sidewall profile can be obtained as discussed herein. In some embodiments, the patterning of the high k dielectric layer 103 and the dummy gate 101' includes a dry etch operation with a chlorine containing plasma. In furtherance of the present embodiment, the dry etch operation utilizes an etch precursor including $Cl_2$ and $BCl_3$. In some embodiments, the dry etch operation includes a gas pressure ranging between about 0.2 mTorr and about 30 mTorr, and an etching temperature ranging between about 10 degrees Celsius and about 70 degrees Celsius. The etching duration of dry etch operation is tuned for proper etching effect and footing control. In the present example, the etching duration ranges between about 1 second and about 200 second. After the dry etch operation, a footing length F is in a range between about 0.5 nm and about 5 nm according to some embodiments. As discussed previously, the footing region 110A can be made of more than one layers, including an interfacial layer and/or a high k dielectric layer.

In some embodiments, after the dummy gate 101' etching operations (usually a polysilicon etching operation), polymeric residues are formed on various surfaces including top surface 100A of the substrate 100 and sidewalls of the patterned dummy gate 101'. In some embodiments, the polysilicon etch generates various polymeric residues including chlorine (Cl)-containing polymer, carbon (C)-containing polymer, fluorine (F)-containing polymer, HBr-containing polymer and/or silicon-containing polymer. The polymeric byproducts function as an etch mask to prevent further etching to the gate dielectric materials. By applying an optional cleaning operation to the semiconductor structure, the unexpected hard mask of the byproducts is removed. The cleaning operation may use any proper cleaning solution, such as hydro-fluorine (HF), hydrochloric acid-hydrogen peroxide-water mixture (HPM), ammonia-hydrogen peroxide-water mixture (APM) or combinations thereof.

Figure 10:
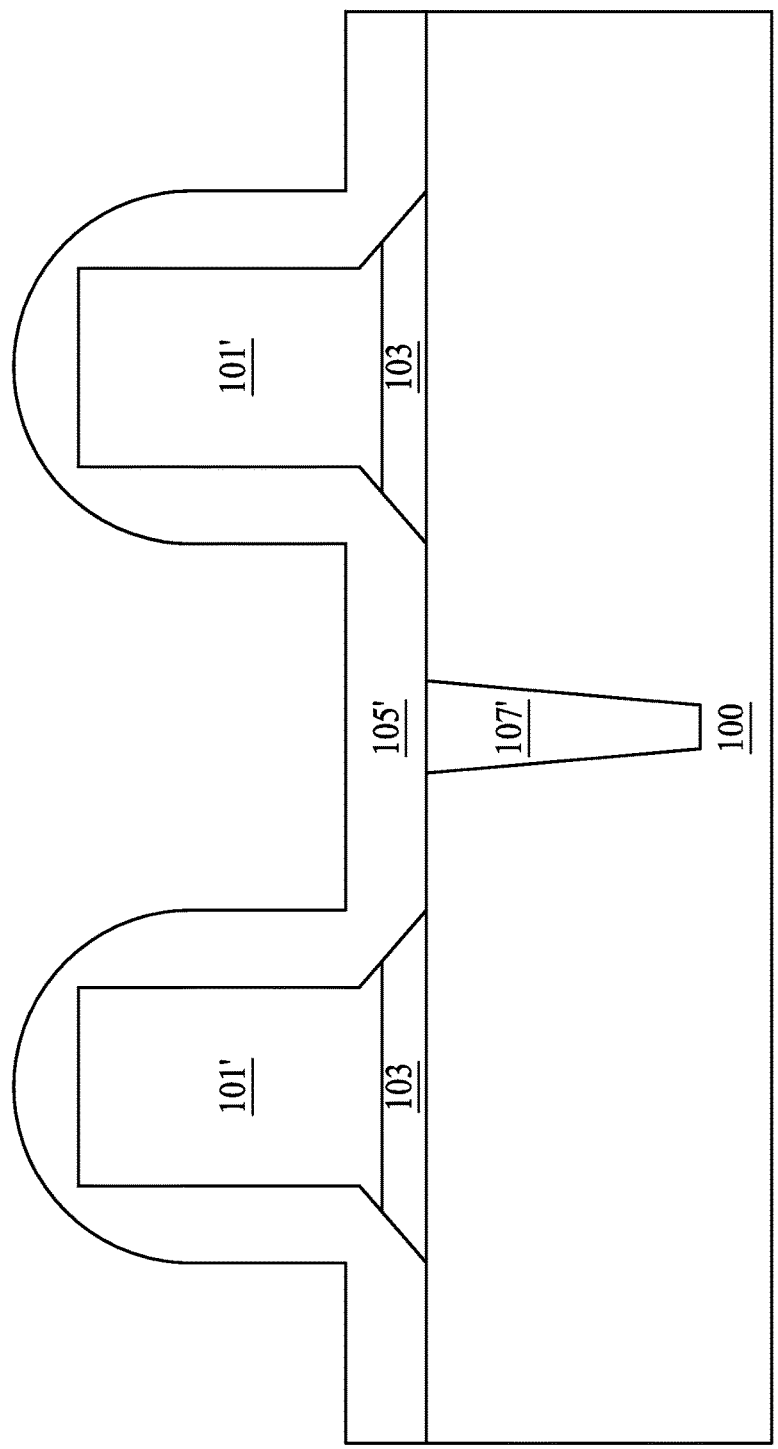
Figure 11:
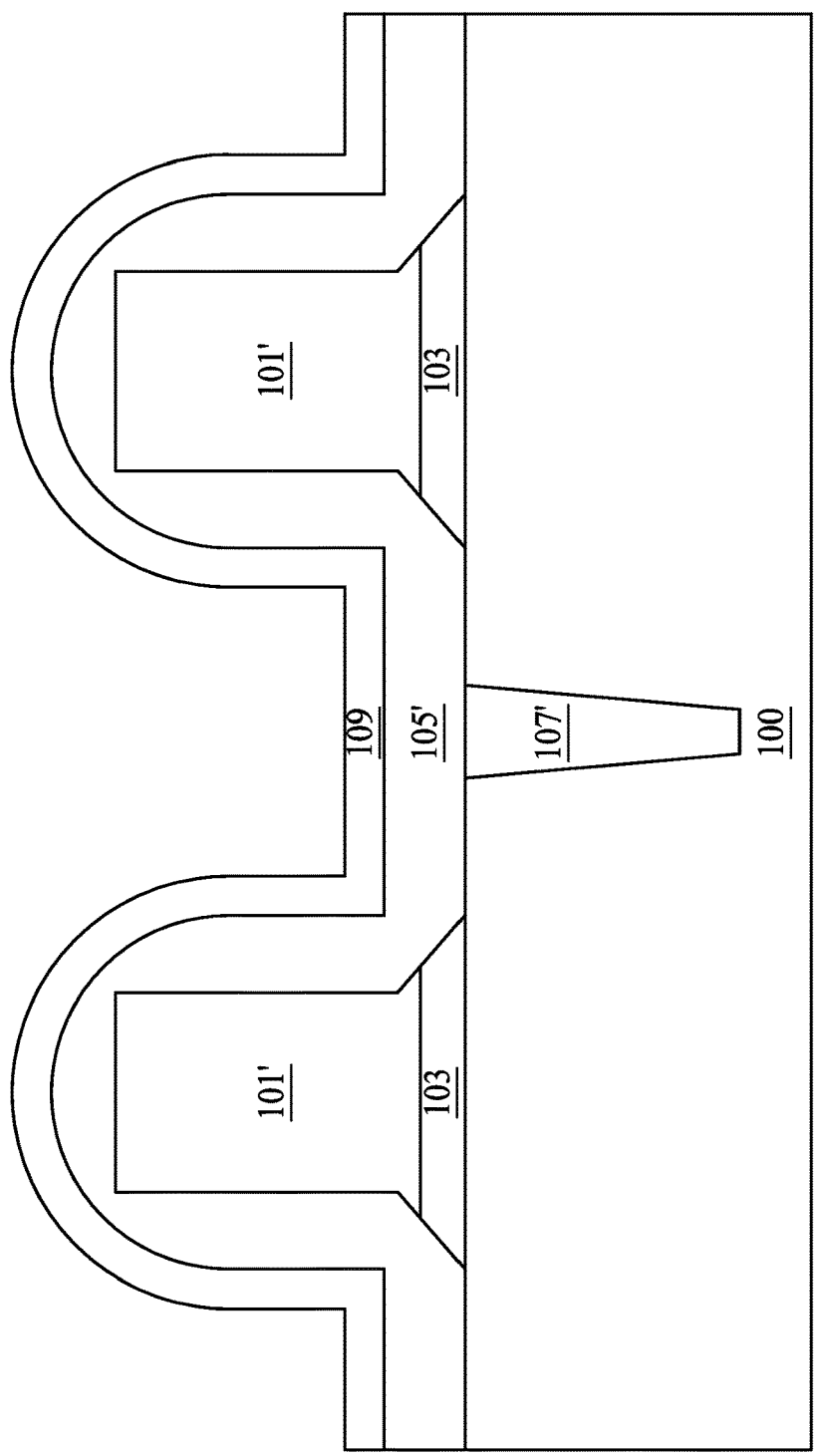

Following the cleaning operation, a spacer layer 105' is conformally deposited over the high k dielectric layer 103 and the dummy gate 101' as shown in FIG. 10. In some embodiments, the spacer layer 105' can be one or more dielectric material, such as silicon oxide, silicon nitride, silicon oxynitride or combinations thereof. In one embodiment, the spacer layer 105' includes a seal spacer disposed on the sidewall of the dummy gate 101' and a main spacer disposed on the seal spacer formed respectively by deposition and etch. In FIG. 11, a plasma oxidation treatment (POT) can be performed to form a protection layer 109 over the spacer layer 105'. In some embodiments, the POT operation includes chemical gas(es) of Ar, HBr, $N_2$, He, $O_2$, and the combinations thereof at a chamber pressure of from about 3 mTorr to about 50 mTorr. The plasma power may be in a range of from about 50 W to about 1000 W, and a chamber temperature is maintained between about 20 degrees Celsius to about 80 degrees Celsius. In some embodiments, the protection 109 is an oxide layer of the underlying spacer layer 105' materials.

Figure 12:
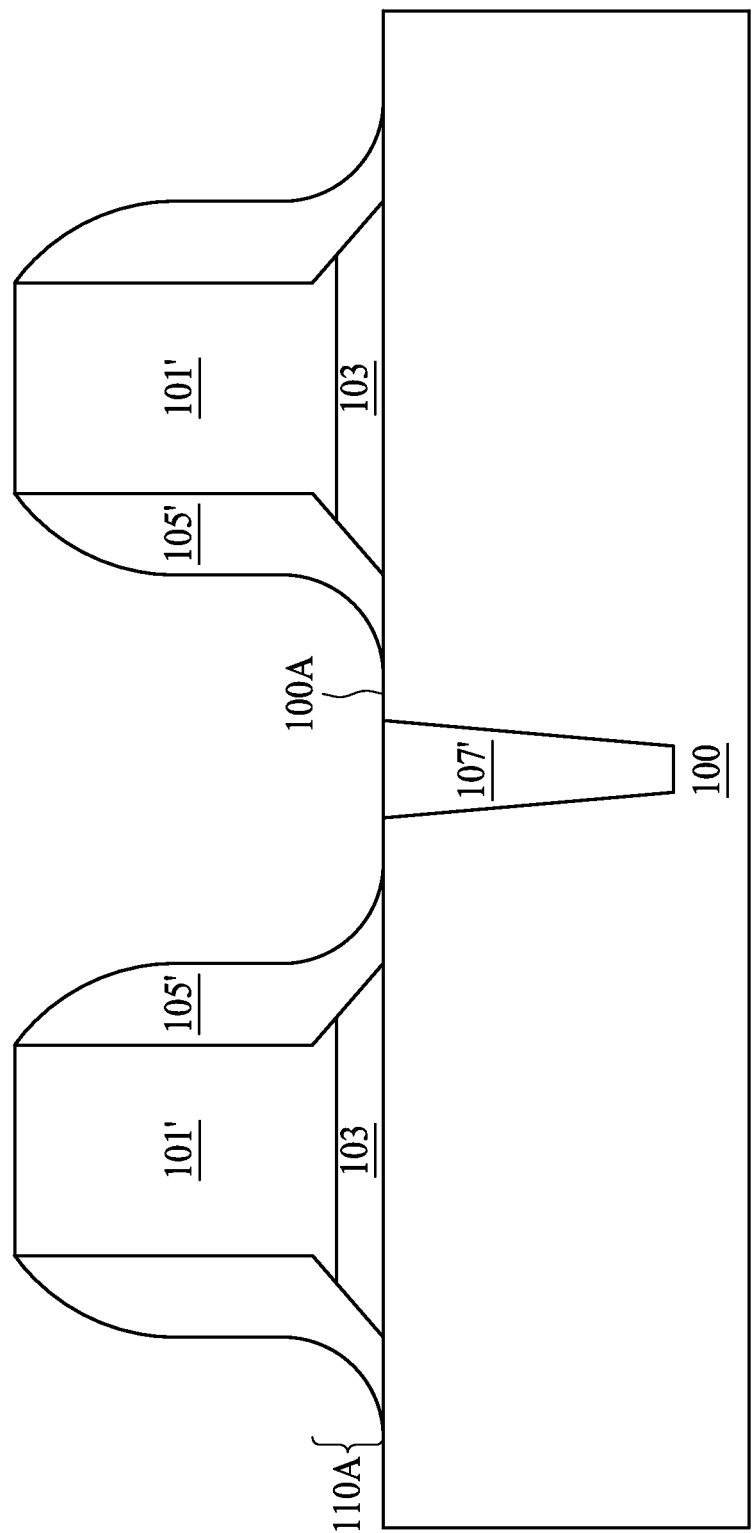

Referring to FIG. 12 and FIG. 13, a two-step etch is performed to obtain an offset sidewall profile shown in FIG. 13. Details of the spacer width S and footing length F shown in FIG. 13 are previously discussed in FIG. 1 and can be referred thereto. The semiconductor structure described herein has a footing length F smaller or equal to the spacer width S. The first of the two-step etch can be a main etch using an etching gas containing $CF_x$, where X is equal to or greater than 4. For example, etching gas(es) for the main etch includes $CF_4$, He, $CH_3F$, $CH_2F_2$, HBr, He, $Cl_2$, and $O_2$, under a pressure of from about 3 mTorr to about 50 mTorr. In some embodiments, $CF_4$ is the major etching gas and He is the major carrier gas. The plasma power may be in a range of from about 50 W to about 1000 W, and a chamber temperature is maintained between about 20 degrees Celsius to about 70 degrees Celsius. As shown in FIG. 12, after the main etch, a top surface 100A of the substrate 100 and a top surface of the dummy gate 101' are exposed. In some embodiments, the main etch is perfumed using an end point mode where the etch operation stops at the exposure of an end point, for example, the top surface 100A of the substrate. The protection layer 109 deposited over the sidewall of the dummy gate 101' alleviate the lateral etching and thus the spacer layer 105', with a tail over the footing region 110A, remains at the sidewall of the dummy gate 101'.

In FIG. 13, the second of the two-step etch can be an overetch for removing the spacer layer 105' in proximity to the footing region 100A and form an offset sidewall spacer 105. In some embodiments, the overetch includes an etching gas containing $CF_3$, hydrogen halides, or the combinations thereof. In some embodiments, the overetch is a polymeric material deposition process where the spacer layer 105' at the sidewall is etched in a substantially lower rate than the spacer layer 105' covering the footing region 100A. For example, etching gas(es) for the overetch includes $CH_3F$, HBr, $CH_2F_2$, Ar, $N_2$, He, and $O_2$, under a pressure of from about 3 mTorr to about 50 mTorr. In some embodiments, $CH_3F$ and HBr are the major etching gas. The plasma power may be in a range of from about 50 W to about 1000 W, and a chamber temperature is maintained between about 20 degrees Celsius to about 70 degrees Celsius. In some embodiments, the overetch is perfumed using a time mode where the etch operation stops after a predetermined amount of time, for example, 10% to 15% of the time mode duration adopted in the main etch.

Referring to FIG. 14 and FIG. 15, a first recess 111' and a second recess 112' are formed by an etching operation at two ends of a channel in the substrate 100. Similarly, the etching operation forms a third recess 113' and a fourth recess 114' in an adjacent transistor as shown in FIG. 14 or in any one transistor in the wafer. In FIG. 15, epitaxially grown materials are formed in each recess 111', 112', 113', 114' for proper strain effect, leading to enhanced carrier mobility in the channel. In some embodiments, silicon germanium is epitaxially grown in the source and region for a pFET. In another embodiment, silicon carbide is epitaxially grown in the source and region for an nFET. The epitaxy regions 111, 112, 113, 114 formed in FIG. 15 demonstrate individual proximities P1, P2, P3, and P4. The definition of proximity is discussed previously in FIG. 6 and FIG. 7 and can be referred thereto. In some embodiments, P1 and P2 are substantially identical. In other embodiments, P1, P2, P3, and P4 are all substantially identical. After the formation of the epitaxy regions 111, 112, 113, 114, the dummy gate 101' can be removed by a suitable etching operation, such as a wet etch. A gate trench is formed after the removal of the dummy gate and being replaced by one or more metal material to form a metal gate. The corresponding replacement operation is referred to as a gate-last operation.

As shown in FIG. 15, one or more metal materials are filled the gate trench, forming a gate body 101 made of metal stacks. In some embodiments, a first metal layer having a proper work function is deposited by a PVD operation in the gate trench, a second metal layer includes aluminum, tungsten or other suitable metal is then deposited by a suitable technique, such as PVD or plating. In another embodiment, a CMP operation is applied to remove the excessive metals, such as the metals disposed over the dielectric layer 107. In FIG. 15, the high k dielectric layer 103 is deposited after the removal of the dummy gate 101' and is deposited in a bottom and at a sidewall of the gate trench. Note FIG. 15 shows a structure of a "high k last" operation where no high k dielectric layer is formed in the gate trench prior to the removal of the dummy gate 101'.

Other operations may follow to form a functional circuit. For example, an interconnect structure is formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure. In another embodiment, tungsten is used to form tungsten plug in the contact holes.

Some embodiments of the present disclosure provide a semiconductor structure, including a substrate having a top surface; a gate over the substrate, the gate including a footing region in proximity to the top surface, the footing region including a footing length laterally measured at a height under 10 nm above the top surface; and a spacer surrounding a sidewall of the gate, including a spacer width laterally measured at a height of from about 10 nm to about 200 nm above the top surface. The footing length is measured, along the top surface, from an end of a widest portion of the footing region to a vertical line extended from an interface between a gate body and the spacer, and the spacer width is substantially equal to or greater than the footing length.

In some embodiments of the present disclosure, the gate includes a high-K dielectric layer over the top surface.

In some embodiments of the present disclosure, the gate includes the high-K dielectric layer at the sidewall of the gate.

In some embodiments of the present disclosure, the spacer width is in a range of from about 2 nm to about 20 nm.

In some embodiments of the present disclosure, the gate further includes at least one of an N-work function layer and a P-work function layer.

In some embodiments of the present disclosure, the semiconductor structure further includes a first epitaxy region partially in the substrate, adjacent to a channel region under the gate, a first proximity of the first epitaxy region being equal to or smaller than the spacer width.

In some embodiments of the present disclosure, the semiconductor structure further includes a second epitaxy region partially in the substrate, adjacent to a channel region under the gate, a second proximity of the second epitaxy region being substantially identical to the first proximity.

Some embodiments of the present disclosure provide a semiconductor structure, including a substrate having a top surface; a metal gate over the top surface; a spacer surrounding a sidewall of the metal gate; and a dielectric layer surrounding the spacer and the metal gate. The metal gate includes a footing region in proximity to the top surface of the substrate, and the footing region, the spacer, and the dielectric layer forms a triple point.

In some embodiments of the present disclosure, the metal gate includes a high-K dielectric layer over the top surface.

In some embodiments of the present disclosure, the metal gate includes the high-K dielectric layer at the sidewall of the metal gate.

In some embodiments of the present disclosure, the footing region includes a footing length measured, along the top surface, from an end of a widest portion of the footing region to a vertical line extended from an interface between the metal gate and the spacer, and the spacer includes a spacer width laterally measured at a height of from about 10 nm to about 200 nm above the top surface, the spacer width being greater than or substantially equal to the footing length.

In some embodiments of the present disclosure, proximity of an epitaxy region partially in the substrate, adjacent to a channel region under the metal gate, being substantially identical or smaller than the spacer width.

In some embodiments of the present disclosure, the semiconductor structure further includes an epitaxy region partially in the substrate, adjacent to a channel region under the metal gate, the epitaxy region being connected to the triple point.

Some embodiments of the present disclosure provide a method for manufacturing a semiconductor structure, the method includes forming a dummy gate over a semiconductor substrate, the dummy gate including a footing region at a surface of the semiconductor substrate; forming a spacer layer conformally surrounding the dummy gate; performing an oxidation operation over the spacer layer; and removing a portion of the spacer layer over the surface of the semiconductor substrate and a top of the dummy gate so that a spacer width, measured laterally measured at a height of from about 10 nm to about 200 nm above the surface of the semiconductor substrate, is substantially equal to or greater than a footing length at the footing region of the dummy gate. The footing length is laterally measured at a height under 10 nm above the surface of the semiconductor substrate.

In some embodiments of the present disclosure, the removing the portion of the spacer layer includes performing an overetch removing the spacer layer in proximity to the footing region.

In some embodiments of the present disclosure, the removing the portion of the spacer layer further includes performing a main etch with $CF_x$, wherein $x \geq 2$.

In some embodiments of the present disclosure, the overetch includes $CH_3F$, hydrogen halides, or the combinations thereof.

In some embodiments of the present disclosure, further including forming a high-K dielectric layer before the forming the dummy gate over the semiconductor substrate.

In some embodiments of the present disclosure, the method further includes removing the dummy gate to form a gate trench; and forming a high-K dielectric layer in a bottom and a sidewall of the gate trench.

In some embodiments of the present disclosure, the method further includes forming a recess in the substrate, adjacent to a channel region under the dummy gate; and forming an epitaxy region in the recess. A proximity of the epitaxy region is substantially equal to or smaller than the spacer width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate having a top surface;
a gate over the substrate, comprising:
 a gate dielectric in proximity to the top surface; and
 a gate body further away from the top surface,
  wherein the gate dielectric is between the gate body and
   the top surface, the gate dielectric further comprising a footing region comprising a footing length laterally measured at a height under 10 nm above the top surface, the footing region having a widest portion in proximity to the substrate and a narrowest portion away from the substrate; and a spacer surrounding a sidewall of the gate body and overlying the footing region, comprising a spacer width laterally measured above the narrowest portion of the footing region, wherein the footing length is measured, along the top surface, from an end of the widest portion of the footing region to a vertical line extended from an interface between the gate body and the spacer, and wherein the spacer width is greater than the footing length, and the spacer is free from contacting the footing region.

2. The semiconductor structure of claim 1, wherein the gate dielectric comprises a high-K dielectric layer over the top surface.

3. The semiconductor structure of claim 2, wherein the gate comprises the high-K dielectric layer at the sidewall of the gate.

4. The semiconductor structure of claim 1, wherein the spacer width is in a range of from about 2 nm to about 20 nm.

5. The semiconductor structure of claim 2, wherein the gate further comprises at least one of an N-work function layer and a P-work function layer.

6. The semiconductor structure of claim 1, wherein the epitaxy region comprises a first epitaxy region, a measure of a first proximity of the first epitaxy region being equal to or smaller than the spacer width.

7. The semiconductor structure of claim 6, wherein the epitaxy region comprises a second epitaxy region, a second proximity of the second epitaxy region being substantially identical to the first proximity.

8. A semiconductor structure, comprising:
a substrate having a top surface;
a metal gate over the top surface, the metal gate comprising:
a gate dielectric in proximity to the top surface of the substrate; and
a gate body further away from the top surface,
wherein the gate dielectric is between the gate body and the top surface, the gate dielectric further comprising a footing region having a widest portion in proximity to the top surface of the substrate and a narrowest portion away from the top surface of the substrate;
an epitaxy region partially in the substrate, adjacent to a channel region under the metal gate, and undercutting the footing region, the epitaxy region being doped; and
a spacer surrounding a sidewall of the metal gate, wherein the spacer is free from contacting the footing region.

9. The semiconductor structure of claim 8, wherein the metal gate comprises a high-K dielectric layer over the top surface.

10. The semiconductor structure of claim 9, wherein the metal gate comprises the high-K dielectric layer at the sidewall of the metal gate.

11. The semiconductor structure of claim 8, wherein the footing region comprises a footing length measured, along the top surface, from an end of a widest portion of the footing region to a vertical line extended from an interface between the metal gate and the spacer, and wherein the spacer comprises a spacer width laterally measured at a height of from about 10 nm to about 200 nm above the top surface, the spacer width being greater than or substantially equal to the footing length.

12. The semiconductor structure of claim 11, wherein a measure of proximity of the epitaxy region is substantially identical or smaller than the spacer width.

13. The semiconductor structure of claim 8, wherein the widest portion in proximity to the substrate of the footing region, the spacer, the dielectric layer, and the epitaxy region form a quadruple point.

14. A semiconductor structure, comprising:
a substrate having a top surface;
a gate over the top surface, comprising:
a gate dielectric in proximity to the top surface; and
a gate body further away from the top surface,
wherein the gate dielectric is between the gate body and the top surface, the gate dielectric further comprising a footing region, the footing region having a widest portion in proximity to the substrate and a narrowest portion away from the substrate;
an epitaxy region partially in the substrate, adjacent to a channel region under the gate, and undercutting the footing region, the epitaxy region being doped;
a spacer surrounding a sidewall of the gate; and
a dielectric layer surrounding the spacer,
wherein the footing region is in proximity to the top surface of the substrate, and the spacer comprises a spacer width laterally measured at a height of from about 10 nm to about 200 nm above the top surface,
wherein a length of the footing region is measured along the top surface, from an end of the widest portion of the footing region to a vertical line extended from an interface between the gate body and the spacer, wherein the spacer width is greater than the footing length, and wherein the spacer is free from contacting the footing region.

15. The semiconductor structure of claim 14, wherein the footing region, the spacer, and the dielectric layer form a triple point.

16. The semiconductor structure of claim 14, wherein a bottom of the spacer is not in contact with the top surface of the substrate.

17. The semiconductor structure of claim 14, wherein the gate is a metal gate.

18. The semiconductor structure of claim 14, wherein the semiconductor structure further comprises a second epitaxy region partially in the substrate, adjacent to a channel region under the gate, a second proximity of the second epitaxy region being equal to or smaller than the spacer width.

19. The semiconductor structure of claim 14, wherein the spacer width is in a range of from about 2 nm to about 20 nm.

* * * * *